United States Patent [19]

Bethards

[11] 4,038,603
[45] July 26, 1977

[54] TRANSMITTER MODULATION LIMITER

[75] Inventor: Charles William Bethards, Schaumburg, Ill.

[73] Assignee: Motorola, Inc., Schaumburg, Ill.

[21] Appl. No.: 670,502

[22] Filed: Mar. 25, 1976

[51] Int. Cl.² .............................................. H04B 1/04
[52] U.S. Cl. ...................................... 325/182; 332/38
[58] Field of Search ............... 325/150, 182, 187, 147; 332/38, 61, 37 R

[56] References Cited

U.S. PATENT DOCUMENTS

| 1,825,304 | 9/1931 | Burnside | 325/150 |
| 2,025,595 | 12/1935 | Kozanowski et al. | 325/150 |
| 2,382,567 | 8/1945 | Hollingsworth | 332/38 |
| 2,491,590 | 12/1949 | Sorensen | 325/187 |
| 3,320,536 | 5/1967 | Lockwood | 332/38 |

Primary Examiner—Robert L. Richardson
Assistant Examiner—Marc E. Bookbinder
Attorney, Agent, or Firm—James W. Gillman; Victor Myer; James P. Hamley

[57] ABSTRACT

A resistor is inserted between the audio signal and the primary winding of a conventional modulating transformer used in an amplitude modulated transmitter. The value of the resistor is selected to limit the peak signals into the transformer thereby limiting the peak instantaneous index of modulation to less than 100 percent.

A capacitor, coupled to the transformers secondary winding, forms a low pass filter with the impedance of the resistor as transformed by the turns ratio of the transformer. The resulting low pass filter attenuates undesired harmonics.

11 Claims, 1 Drawing Figure

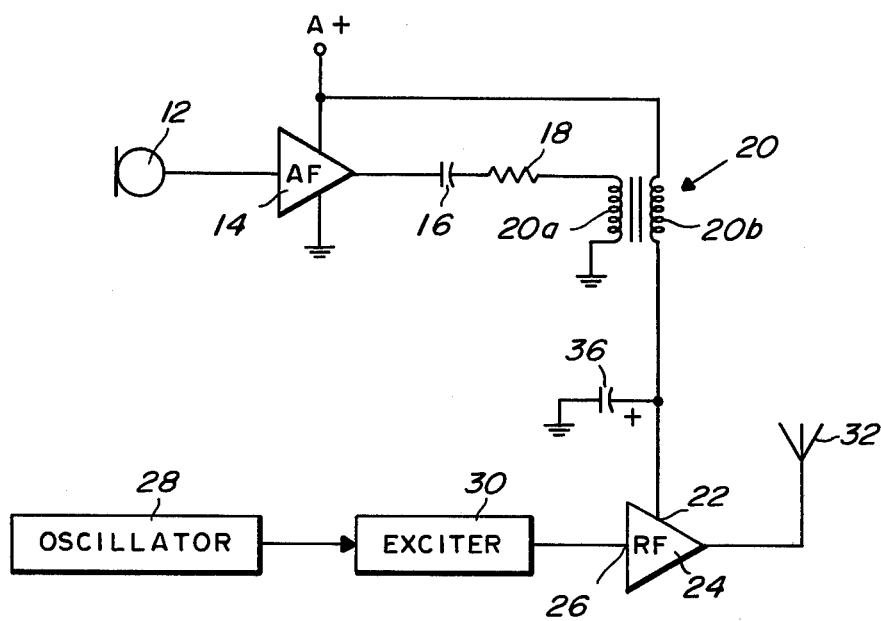

TRANSMITTER MODULATION LIMITER

BACKGROUND OF THE INVENTION

The present invention pertains to the radio communication art and, more particularly, to a means for limiting the peak modulation of an amplitude modulated signal.

Systems for amplitude modulating a radio frequency carrier are well known in the communication art. A common system employs a modulating transformer having primary and secondary windings. The primary winding is driven from the modulating signal, ordinarily an audio information signal, with the secondary feeding to a radio frequency modulating stage. The modulating stage amplitude modulates stage amplitude modulates a generated radio frequency carrier by the transformed information signal.

Prior art amplitude modulating systems employing a modulating transformer have suffered from several problems. Firstly, amplitude modulating schemes are normally limited to a maximum index of modulation, commonly 100 percent. Modulation above this level may be legally restricted, or may result in undesirable distortion in the transmitted signal. However, transmitted power is directly related to the level of the index of modulation, whereby for maximum radiating area a transmitter should operate at a high percent modulation. Thus, conventional modulating transformer schemes resulted in a tradeoff of either over modulating the carrier on information signal peaks, thereby producing adjacent channel splatter and signal distortion, or under modulating the RF carrier with the result that the maximum radiating range of the transmitter is significantly reduced.

SUMMARY OF THE INVENTION

It is an object of this invention, therefore, to provide a means for use with the modulating transformer of an amplitude modulated transmitter which limits the index of modulation to a predetermined level.

It is a further object of the invention to provide the above described modulation limiting means which also provides a means to operate the transmitter at a high index of modulation to allow a wide radiating area.

An additional object of the present invention is to provide the above described modulation limiting means which includes a means to minimize distortion and adjacent channel splatter of the amplitude modulated signal.

Briefly, according to the invention, the improved modulation limiter is intended for use in an amplitude modulated transmitter wherein an information signal amplitude modulates a radio frequency carrier. The improved modulation limiter comprises a modulation transformer having primary and secondary windings. The radio frequency carrier is modulated by the signal appearing at the secondary winding of the modulation transformer, whereby the index of modulation of the RF carrier is dependent on the amplitude of the transformer secondary signal. A limiting means is adapted for coupling the information signal to the primary winding of the modulation transformer. The limiting means has a predetermined impedance such that the amplitude of the information signal appearing at the secondary of the modulation transformer modulates the RF carrier to, but not in excess of, a predetermined index of modulation.

In addition, an impedance means, e.g. a capacitor, may be coupled to the secondary of the modulation transformer thereby forming a filter network. The filter network has a characteristic which is dependent on the impedance of the limiting means as transformed through the modulation transformer. This filter characteristic may be selected to attenuate undesired harmonics in the modulating signal which may result in adjacent channel splatter or distortion of the amplitude modulated radio frequency carrier.

BRIEF DESCRIPTION OF THE DRAWING

The sole FIGURE of the invention illustrates, in schematic diagram form, a preferred embodiment of the improved modulation limiting means in combination with an amplitude modulated radio frequency transmitter.

DESCRIPTION OF THE PREFERRED EMBODIMENT OF THE INVENTION

Referring to the figure, information or audio signals are picked up by a microphone 12, and transduced to appropriate electrical signals which are applied to the input of an audio frequency amplifier 14. Amplifier 14, biased off of a DC bias supply A+, amplifies the audio signals from the microphone 12 in the normal manner. The amplifier 14 includes internal circuitry to bias its output at one half the A+ supply. This assures symmetric clipping of the audio signals dispite variation in the A+ supply level, such A+ supply variations are common, especially in mobile transceiver applications. The amplified audio signals from audio frequency amplifier 14 are coupled to a DC blocking capacitor 16 and a current limiting resistor 18 through the primary winding 20a of a modulation transformer 20 and to ground potential. Modulation transformer 20 has a secondary winding 20b, one free end of which couples to the same DC bias supply A+, as is the audio amplifier 14. Thus, the RF stage tracks the audio stage whereby the total modulating system is largely immune to A+ supply variations. The remaining free end of secondary winding 23b of modulating transformer 20 couples to the modulating input 22 of a radio frequency modulating stage 24. Applied to a second input 26 of the radio frequency modulating stage 24 is an RF carrier signal generated by an oscillator 28 and amplified by an exciter 30. The RF modulator stage 24 amplitude modulates the RF carrier applied at input 26 by the signals appearing at the secondary winding 20b the modulating transformer 20. The resulting amplitude modulated carrier is broadcast over an antenna 32. A filter capacitor 36 couples from the commom connection of the transformer secondary winding 20b and the radio frequency modulating stage input 22 to ground potential, as will be more fully described hereinbelow.

Operation of the modulation limiting circuit may be understood as follows. The audio information signals from the microphone 12 appearing at the output of audio frequency amplifier 14 are constrained to peak values at the DC bias A+ level, and ground potential. Thus, the maximum voltage appearing across the primary 20a of the modulating transformer 20 is fixed. Since the index of modulation of the RF carrier signal in modulating stage 24 is dependent on the peak amplitude swing of the modulating signal at the transformer secondary winding 20b, and since the peak level of the signal appearing at the secondary 20b is dependent on the peak level swing of the signal at the primary 20a, the index of modulation may be controlled by controlling the signal level swing in the transformer winding 20a. Thus, by proper selection of the resistance of the resistor 18 the instantaneous index of modulation of the RF carrier may be controlled. In this particular application, the value of the resistor 18 was selected to limit the absolute modulation index to less than 100 percent.

In general, the peak amplitude of speech is 6–12 db above the RMS value. Also, the instantaneous amplitude of speech is less than one-fourth the RMS value for approximately 50 percent of the time. In band limited two-way communication the peak audio signals may be limited without a significant loss in intelligibility. The peak limiting provided by the inventor results in a decrease in the peak to average ratio of the transmitted signal, whereby the transmitter may operate at a higher average index of modulation, thus enhancing the transmitter's effective radiating area. This benefit is realized without overmodulating the transmitter and without a significant degradation in the intelligibility of the transmitted signal.

The filter capacitor 36 helps attenuate harmonic signals, and thus adjacent channel splatter, resulting from non-linearities in the modulating transformer 20 and audio amplifier 14. The capacitor 36 is chosen to have a capacitance whereby it forms a low pass filter network with the value of the resistance of resistor 18 as transformed through the modulating transformer 20 in parallel with the inherent modulator impedance. Assuming that the turns ratio of the modulating transformer 20 is A, the effective resistance appearing in series with the secondary 20$b$ of the transformer 20 is given as $(A^2) \times R$, where R is the value of the resistor 18. For audio information signals the value of the capacitor 36 is selected to provide a 3 db rolloff beginning from 3 to 5.5 kilohertz.

It should be noted that without the current limiting resistor 18, along with the impedance transforming of the modulating transformer 20, the value of the filter capacitor 36 to provide the desired rolloff characteristic would have to be several times its value in the preferred embodiment, thereby adding to the cost of the modulating circuit.

In summary, a modulating limiter circuit has been described for use in amplitude modulated transmitters employing modulating transformer. The limiter controls the peak instantaneous modulation of the RF carrier, while allowing for higher average modulation level and, thereby, an increased effective transmitter radiating area. In addition, means have been disclosed for reducing distortion and adjacent channel splatter of the above described amplitude modulated system.

While a preferred embodiment of the invention has been described in detail, it should be apparent that many modifications amd variations thereto are possible, all of which fall within the true spirit and scope of the invention.

I claim:

1. In an amplitude modulated transmitter wherein an information signal amplitude modulates a radio frequency (RF) carrier, the improvement comprising:
   a modulation transformer having primary and secondary windings;
   means for modulating the RF carrier with the signal appearing at the secondary winding of the modulation transformer, the index of modulation of the RF carrier dependent on the amplitude of said transformer secondary signal;
   resistor limiting means adapted for coupling the information signal to the primary winding of the modulation transformer, the limiting means having a predetermined resistance such that the amplitude of the information signal appearing at the secondary of the modulation transformer modulates the RF carrier to, but not in excess of, a predetermined index of modulation; and
   immpedance means coupled to the secondary of the modulation transformer for forming a filter network, having a predetermined characteristic, with the resistance of the resistor limiting means as transformed through the modulation transformer.

2. The improvement of claim 1 wherein the resistance of the resistor is selected to limit the index of modulation to less than 100 percent.

3. The improvement of claim 1 wherein the impedance means includes a capacitor of selected value for forming a low pass filter with the transformed resistance of the resistor limiting means.

4. A transmitter comprising:
   a source of bias potential;
   a source of information signals, coupled to the source of bias potential, the information signals having a peak amplitude which is predeterminedly dependent on said bias potential;
   a radio frequency (RF) carier source;
   a modulating means, having a modulating input, for amplitude modulating the RF carrier with a signal applied to the modulating input, the index of modulation being dependent on the amplitude of the modulating signal, said modulating means further coupled to the source of bias potential such that variations thereof cause a predetermined change in the index of modulation for a constant level of signals at the modulating input;
   a modulating transformer having primary and second windings;
   means for coupling the signal appearing at the secondary of the transformer to the modulating input of the modulating means; and
   impedance means for coupling the source of information signals to the primary winding of the modulating transformer, the impedance means of predetermined value to limit the peak signal appearing at the secondary of the modulating transformer, thereby controlling the maximum index of modulation,
   and whereby variations in the source of bias potential are compensated for by the source of information signals and the modulating means to maintain the transmitter index of modulation at a substantially constant level independent of said source of bias potential.

5. The transmitter of claim 4 further comprising:
   second impedance means coupled to the secondary of the modulating transformer for forming a filter network, having a predetermined characteristic, which filter network characteristic is dependent on the value of the impedance means as transformed through the modulating transformer.

6. The transmitter of claim 4 wherein the value of the impedance means is selected to limit the index of modulation to less than 100 percent.

7. The transmitter of claim 4 wherein the modulating means is coupled to the source of bias potential through the secondary winding of the modulating transformer.

8. The transmitter of claim 7 wherein the impedance means comprises a resistor having a predertermined resistance value.

9. The transmitter of claim 8 further comprising:

second impedance means coupled to the secondary of the modulating transformer for forming a filter network, having a predetermined characteristic, which filter network characteristic is dependent on the value of the resistor as transformed through the modulating transformer.

10. The transmitter of claim 8 further comprising a capacitor coupled to the secondary of the modulating transformer, the capacitor of selected value to form a low pass filter, having a predetermined characteristic, with the resistance of the resistor as transformed through the modulating transformer.

11. The transmitter of claim 8 wherein the resistance of the resistor is selected to limit the index of modulation to less than 100 percent.

* * * * *